United States Patent [19]

Nagaraj et al.

[11] Patent Number: 5,278,446
[45] Date of Patent: Jan. 11, 1994

[54] REDUCED STRESS PLASTIC PACKAGE

[75] Inventors: Benamanahalli K. Nagaraj; Timothy L. Olson, both of Phoenix; Udey Chaudhry, Mesa, all of Ariz.

[73] Assignee: Motorola, Inc., Schaumburg, Fla.

[21] Appl. No.: 909,508

[22] Filed: Jul. 6, 1992

[51] Int. Cl.$^5$ ............... H01L 23/02; H01L 23/28; H01L 23/12
[52] U.S. Cl. .................. 257/707; 257/706; 257/787
[58] Field of Search ........... 357/81; 257/706, 707, 257/720, 722, 787, 796

[56] References Cited

U.S. PATENT DOCUMENTS 4,107,727  8/1978  Ikezawa et al. .
4,939,570  7/1990  Bickford et al. .................. 357/81
4,994,897  2/1991  Golubic et al. ................... 357/81
5,091,341  2/1992  Asada et al. ...................... 357/81
5,138,430  8/1992  Gow, 3rd et al. ................ 357/81

Primary Examiner—Sheila V. Clark
Attorney, Agent, or Firm—Michael A. Waters

[57] ABSTRACT

A plastic package (10) with a heat sink (11, 27, 28, 32) has a stress relief wall (18, 21, 33) formed on its upper surface. A semiconductor die (12) is mounted on the heat sink (11, 27, 28, 32) such that the top of a semiconductor die (12) is below the level of the top of the wall (18, 21, 33), and the wall (18, 21, 33) absorbs stresses which otherwise would be applied to the semiconductor die (12). The package (10) is simple to fabricate and assemble, and provides a mold lock (23, 24, 31) which serves to hold the plastic material (13) tightly to the heat sink (11, 27, 28, 32). Extra die bond material (26) can be used to increase heat flow without compromising other characteristics of the package (10).

1 Claim, 4 Drawing Sheets

REDUCED STRESS PLASTIC PACKAGE

BACKGROUND OF THE INVENTION

The present invention relates, in general, to semiconductor packages, and more particularly, to a plastic semiconductor package having a heat sink and stress relieving wall.

Semiconductor packages are manufactured in various shapes and sizes and typically have a number of interface leads protruding from one or more sides. Typically, a high power semiconductor die is mounted on a heat sink which makes up the bottom surface of the package. Since the plastic encapsulation does not completely surround the heat sink, delamination or separation of the plastic from the heat sink can occur. As a result, a locking device is typically provided in the heat sink to increase the adhesion of the plastic to the heat sink. Even though the plastic material is firmly fastened to the heat sink, the semiconductor die can crack or be separated from the heat sink due to the difference of coefficient of thermal expansion between the plastic material and the heat sink. Even if failure does not occur, the semiconductor die is placed under high stress, potentially altering the electrical characteristics of the die.

An example of a locking device is found in U.S. Pat. Pat. No. 4,107,727, entitled "A Resin Sealed Semiconductor Device", issued Aug. 15, 1978 to Ryuichi Ikezawa et al, which is incorporated herein by reference. A multi-piece structure is used which incorporates a flange serving to hold the plastic in intimate contact with the heat sink. The semiconductor die is mounted on a pedestal between the locking devices. One embodiment of the pedestal includes a shallow recess in which to bond the semiconductor die. Another form of locking device is shown in U.S. Pat. No. 4,994,897 issued Feb. 19, 1991, entitled "Multi-level Semiconductor Package" issued Feb, 19 1991 to T. R. Golubic et al, which is incorporated herein by reference. The plastic semiconductor package has a plurality of protrusions which serve to lock the plastic material to the heat sink. In addition, the semiconductor die is recessed slightly into the pedestal so as to minimize the length of wire bonds.

These packages address the problem of locking the plastic material to the heat sink. Some designs allow excess die bond material to extend beyond the intended area and flow into the recesses intended for locking of the plastic material. Furthermore no attempt is made to provide stress relief for the semiconductor die or the die bond. Accordingly even though the semiconductor die is recessed slightly in certain of these packages and others provide a flange for a locking device, the depth of recess or height of the flange is not considered to be sufficient to provide significant stress relief for the semiconductor die.

There is a need for a plastic package for housing a semiconductor die which provides stress relief for the semiconductor die. The package should be economical to build, extremely reliable, and should lock the plastic material to the heat sink. The method should be easy to assemble and die bond material extending beyond the intended area should not compromise reliability.

SUMMARY OF THE INVENTION

The present invention provides a unitary heat sink having a stress relieving wall. A semiconductor die is mounted on the heat sink such that the top of a semiconductor die is below the level of the top of the stress relieving wall. The stress relieving wall absorbs stresses which otherwise would be applied to the die. The package is simple to fabricate and assemble, and provides locking shapes which serve to hold the plastic material tightly on the heat sink. Extra die bond material can be used to increase heat flow without compromising other characteristics of the package.

DETAILED DESCRIPTION OF THE DRAWINGS

Figure 1:
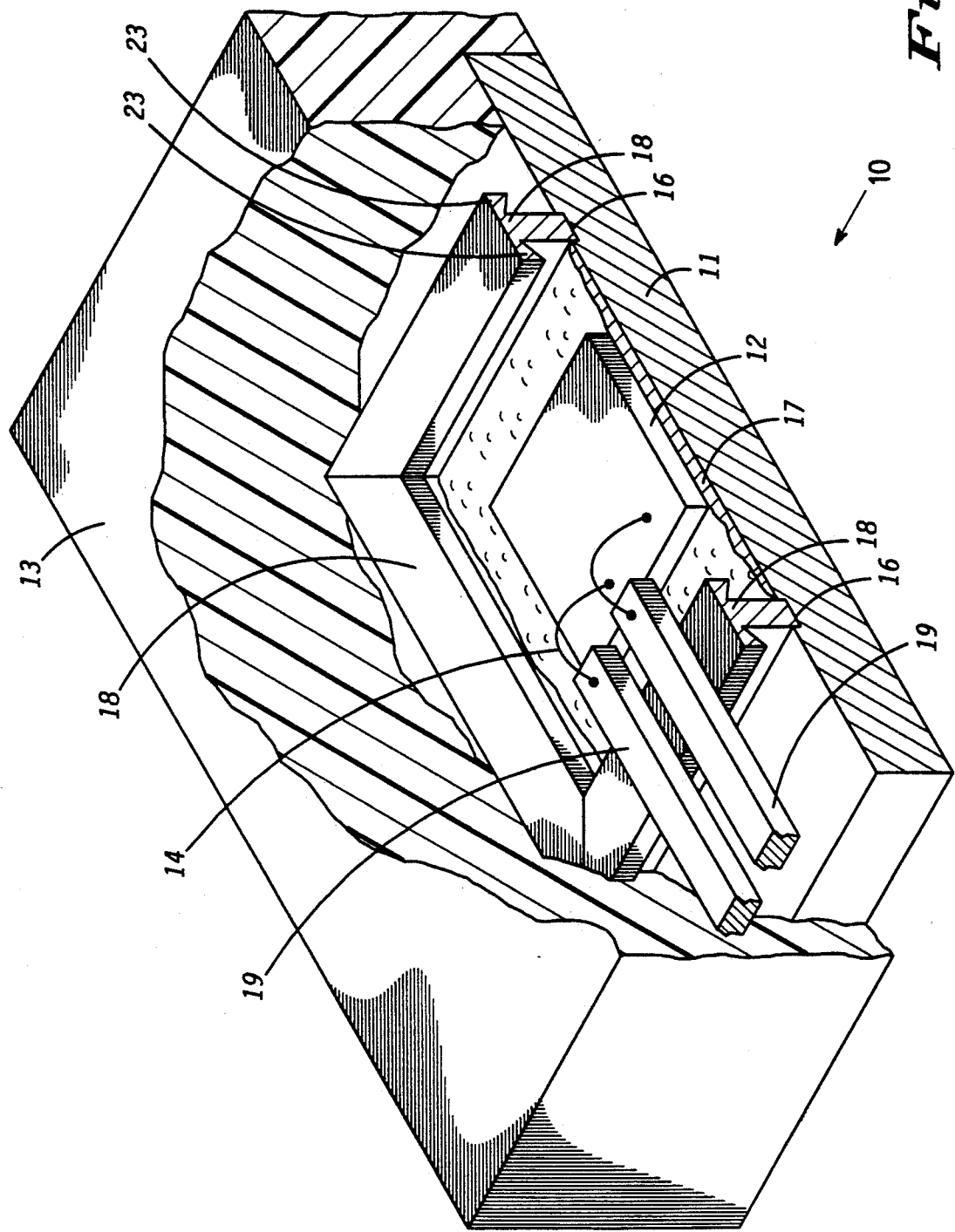
FIG. 1 shows a cut-a-way perspective side view of a plastic package having a stress relieving wall.

FIG. 1 illustrates a cut-a-way side view, in perspective, of a plastic package 10 having a stress relieving wall 18 as a first preferred embodiment in accordance with the present invention. A semiconductor die 12 is bonded to a unitary heat sink 11 by a die bond 17. Unitary heat sink 11 is typically fabricated from a single block of thermally conductive material such as copper. Unitary heat sink 11 typically comprises a single level heat sink without pedestals or other protrusions. Die bond 17 typically is made up of a solder material. Stress relieving wall 18 surrounds both semiconductor die 12 and die bond 17. In this example, a plurality of leads 19 extend outside plastic package 10 into close proximity of an edge of semiconductor die 12. Each lead 19 is electrically coupled to semiconductor die 12 by a conductive wire 14. Stress relieving wall 18 serves as a support shelf for leads 19 during wire bonding of conductive wires 14 to leads 19, but leads 19 do not contact stress relieving wall 18 subsequent to wire bonding. Semiconductor die 12, leads 19, and stress relieving wall 18 are encapsulated in a plastic material 13. The final height of stress relieving wall 18 is such that the top of stress relieving wall 18 is substantially at or above the top surface of semiconductor die 12. In this way, stress relieving wall 18 serves to isolate semiconductor die 12 and die bond 17 from stresses due to plastic material 13. It is important that stress relieving wall 18 not be substantially lower than $\frac{1}{2}$ the thickness of semiconductor die 12 lest semiconductor die 12 be subjected to undue stress from plastic material 13.

A trench 16 is cut into unitary heat sink 11 around the periphery of semiconductor die 12. Stress relieving wall 18 is typically press fitted in trench 16, but may also be held in place by other means such as pins or rivets. The top of stress relieving wall 18 is flattened to form a mold lock 23 which serves to grip plastic material 13 and to hold plastic material 13 firmly in contact with unitary heat sink 11. Mold lock 23 may be formed into a variety of shapes depending on specific requirements, the "T" shape shown being typical. Another common shape for mold lock 23 extends the overhang to only one side of stress relieving wall 18. An alternative embodiment does not form mold lock 23 on stress relieving wall 18. Another embodiment widens stress relieving wall 18 at a point below the top surface so as to form mold locks.

Figure 2:
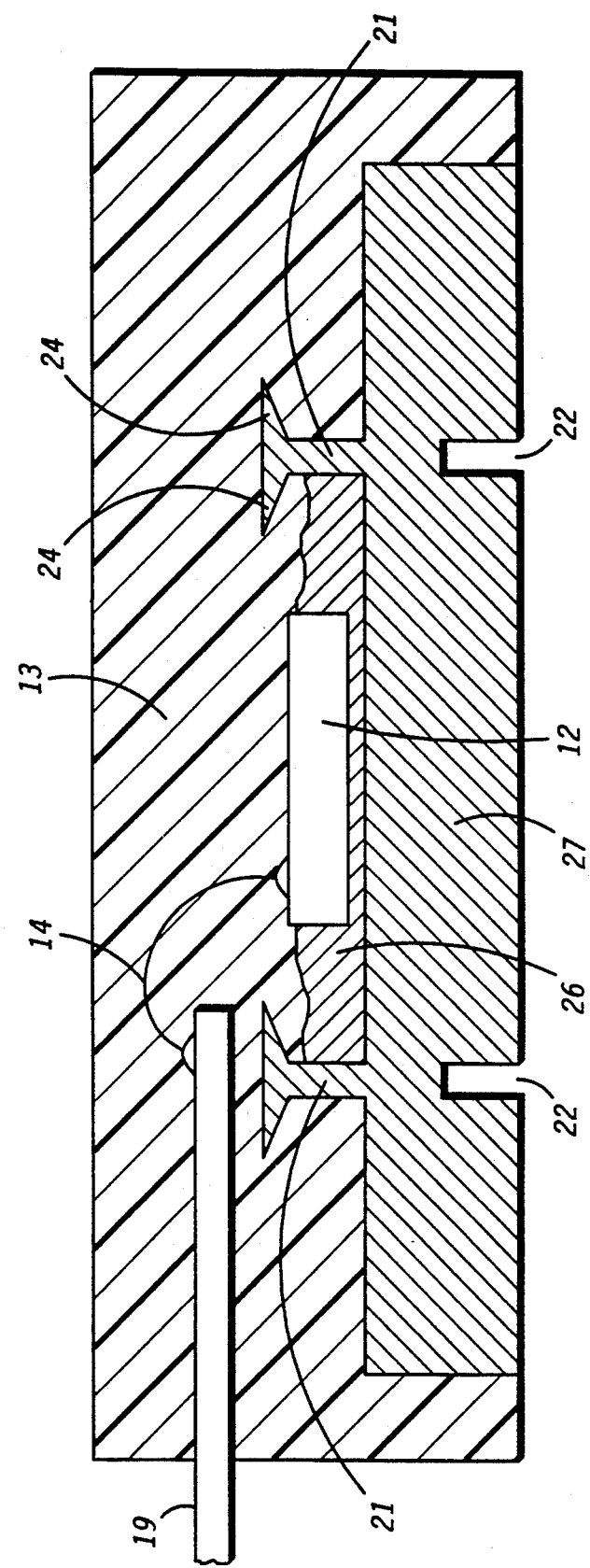
FIG. 2 shows a cross-section view of a plastic package having an alternative stress relieving wall.

FIG. 2 shows a cross-sectional side view of a plastic package having an alternative stress relieving wall as a second preferred embodiment in accordance with the present invention. A stress relieving wall 21 surrounds semiconductor die 12 in the same way as stress relieving wall 18 (FIG. 1). Stress relieving wall 21 is fabricated by stamping or pressing from beneath a unitary heat sink 27 to extrude material above the surface of unitary heat sink 27 and form stress relieving wall 21. This stamping or pressing leaves a cavity 22 on the lower surface of unitary heat sink 27. Stress relieving wall 21 has a mold lock 24 formed on its upper surface which serves to hold plastic molding material 13 firmly in contact with unitary heat sink 27. A die bond 26 fastens semiconductor die 12 to unitary heat sink 27. Excess material from die bond 26 often spills over into a void between semiconductor die 12 and stress relieving wall 21. Due to the configuration of unitary heat sink 27 and stress relieving wall 21 the excess material is not harmful, but instead serves to improve heat flow between semiconductor die 12 and unitary heat sink 27. In the embodiment shown in FIG. 2, extra material has purposely been added to die bond 26 so as to fill the void between the edges of semiconductor die 12 and stress relieving wall 21. The extra material added to die bond 26 serves as a thermally conductive material filling each side of semiconductor die 12 so as to thermally couple semiconductor die 12 to stress relieving wall 21.

Figure 3:
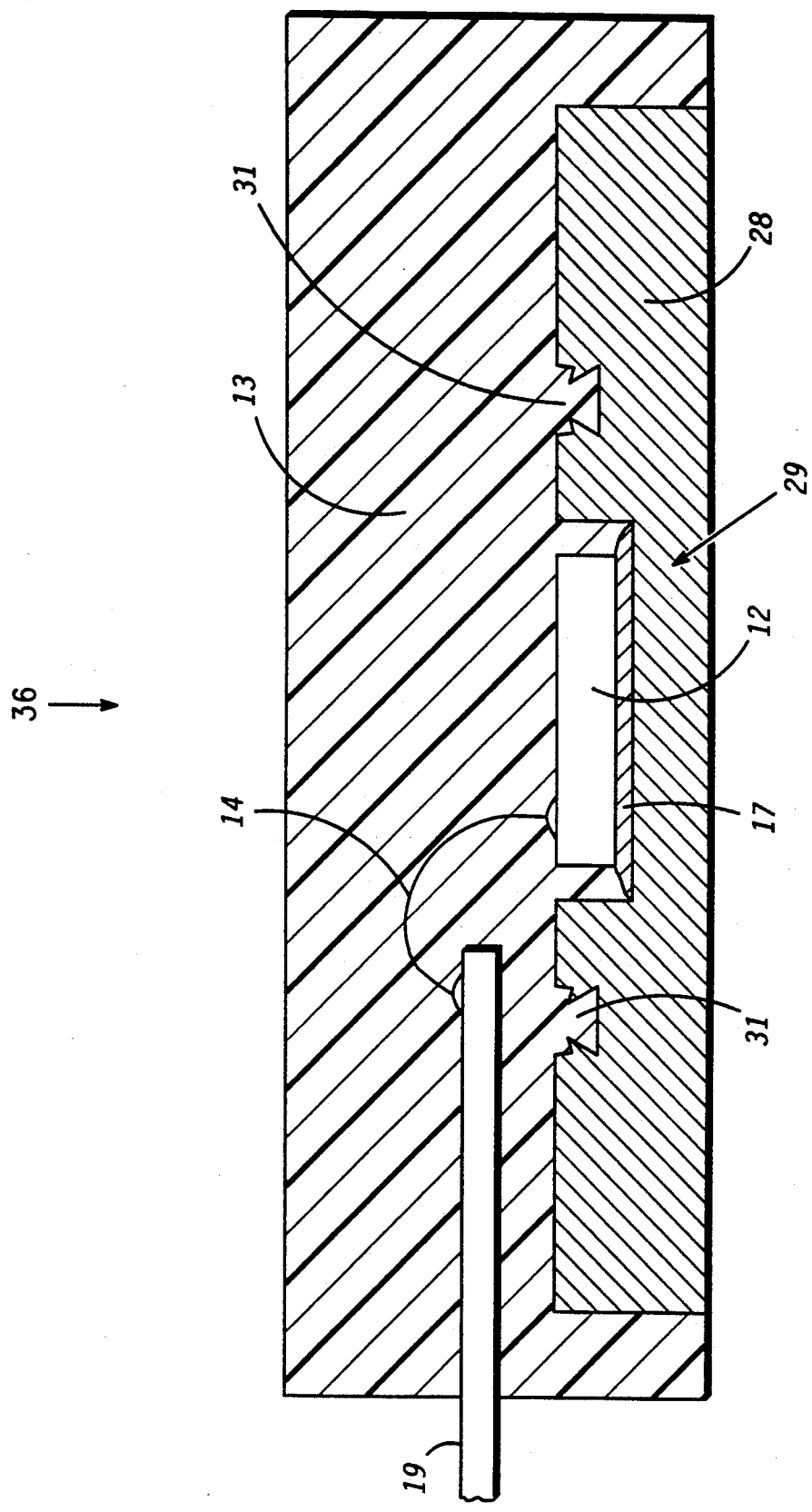
FIG. 3 shows a cross-section view of a plastic package having a recessed die cavity.

FIG. 3 shows a cross-sectional side view of a plastic package 36 having a recessed die cavity 29 as a third preferred embodiment in accordance with the present invention. A unitary heat sink 28 has recessed die cavity 29 formed on the upper surface which is large enough to contain semiconductor die 12. Recessed die cavity 29 is deep enough so that at least ⅔ of semiconductor die 12, mounted on die bond 17, is mounted below the upper surface of unitary heat sink 28. A mold lock 31 is formed on the upper surface of unitary heat sink 28. Typically mold lock 31 surrounds cavity 29. Recessed die cavity 29, and mold lock 31 are typically formed by stamping unitary heat sink 28.

This embodiment has the advantage that semiconductor die 12 is closer to a neutral stress axis of flexure of plastic package 36, further reducing the stress on semiconductor die 12. The neutral stress axis of flexure of plastic package 36 is the point at which there is neither tensile nor compressive stress in plastic package 36. As a result, tensile stress due to flexure of plastic package 36 will primarily be located near the center of the semiconductor die 12. Other packages concentrate tensile stress near the lower surface of semiconductor die 12. The crystal lattice near the lower surface of semiconductor die 12 is typically damaged by grinding and dicing operations during manufacture leaving microscopic scratches in the material. By contrast the crystal lattice near the center of semiconductor die 12 is not machined or polished and hence is typically undamaged. A damaged crystal lattice will propagate existing cracks while an undamaged crystal lattice will simply flex under the same stress. As a result this embodiment provides a higher level of protection against cracking of semiconductor die 12 when compared to other embodiments in accordance with the present invention.

Figure 4:
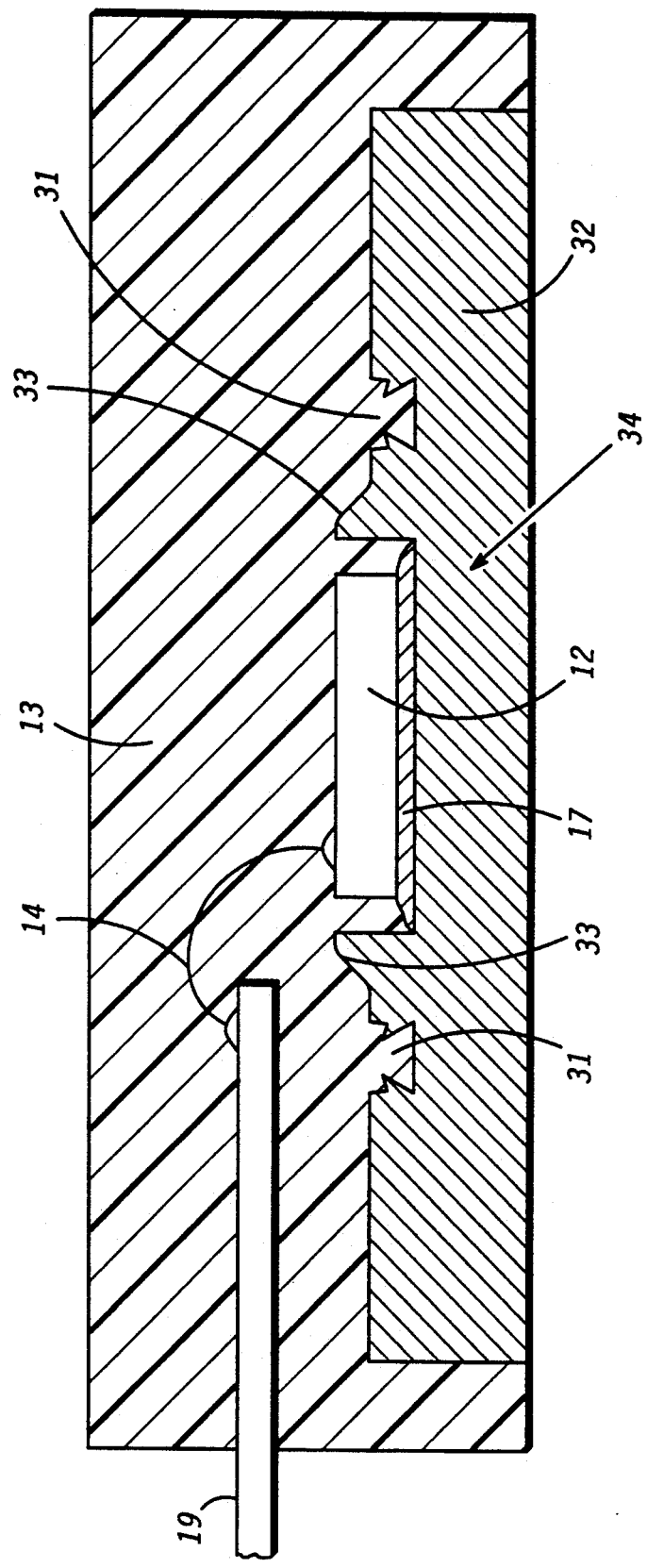
FIG. 4 shows a cross-section view of a plastic package having a partially recessed die cavity.

FIG. 4 shows a cross-sectional side view of a plastic package having a recessed die cavity 34 in a unitary heat sink 32 as a fourth preferred embodiment in accordance with the present invention. Recessed die cavity 34 is shallower than recessed die cavity 29 (FIG. 3), but is surrounded by a ridge 33 which exposes less than 1/3 of semiconductor die 12 mounted on die bond 17. Ridge 33 is typically formed from material which flows from recessed die cavity 34 during the stamping process.

The invention provides a plastic package for housing a semiconductor die with stress relief for the semiconductor die. The package is economical to build, extremely reliable, and locks the plastic encapsulating material to the unitary heat sink. The package is easy to assemble and reliability is not compromised by the die attach material extending beyond the intended area.

We claim:

1. A reduced stress plastic package, comprising:
   a unitary heat sink having an upper surface;
   a mold lock formed on the upper surface of the unitary heat sink;
   a recessed die cavity of predetermined size and depth formed on the upper surface of the unitary heat sink;
   a semiconductor die mounted within the recessed die cavity by a die attach material which spills over into a void between the semiconductor die and the unitary heat sink, at least two thirds of the semiconductor die being lower than the upper surface of the unitary heat sink and wherein the recessed die cavity is formed to a depth which mounts the semiconductor die at a depth in the vicinity of the neutral stress axis of flexure for the reduced stress plastic package;
   a plurality of leads positioned above the semiconductor die which are electrically coupled to the semiconductor die by a plurality of bonding wires; and
   a plastic material which encapsulates the semiconductor die and the upper surface of the unitary heat sink.

* * * * *